(12) United States Patent
Bae et al.

(10) Patent No.: US 10,544,359 B2
(45) Date of Patent: *Jan. 28, 2020

(54) METHOD FOR PREPARING SEMICONDUCTOR NANOCRYSTAL SILOXANE COMPOSITE RESIN COMPOSITION

(71) Applicant: KOREA ADVANCED INSTITUTE OF SCIENCE AND TECHNOLOGY, Daejeon (KR)

(72) Inventors: Byeong-Soo Bae, Daejeon (KR); Hwea Yoon Kim, Daejeon (KR); Junho Jang, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/917,956

(22) Filed: Mar. 12, 2018

(65) Prior Publication Data

US 2018/0273838 A1    Sep. 27, 2018

(30) Foreign Application Priority Data

Mar. 24, 2017   (KR) ........................ 10-2017-0037832

(51) Int. Cl.
  *H01B 1/08*      (2006.01)
  *C09K 11/02*     (2006.01)
  (Continued)

(52) U.S. Cl.
  CPC .............. *C09K 11/02* (2013.01); *C08G 77/52* (2013.01); *C08L 83/04* (2013.01); *C09K 11/54* (2013.01);
  (Continued)

(58) Field of Classification Search
  CPC .. C08L 83/04; C08K 3/08; C08K 5/07; C08G 77/20; C08G 77/52; C08G 77/70;
  (Continued)

(56) References Cited

U.S. PATENT DOCUMENTS

2017/0096599 A1*   4/2017  Han .................... C09K 11/565

FOREIGN PATENT DOCUMENTS

| KR | 10-0593689      | 6/2006  |
| KR | 10-2011-0110669 | 10/2011 |
| KR | 10-2015-0115796 | 10/2015 |

OTHER PUBLICATIONS

Kim, H. Y. et al., "Quantum Dot/Siloxane Composite Film Exceptionally Stable against Oxidation under Heat and Moisture", Journal of the American Chemical Society, 2016, vol. 138, pp. 16478-16485.

* cited by examiner

*Primary Examiner* — Mark Kopec
*Assistant Examiner* — Jaison P Thomas
(74) *Attorney, Agent, or Firm* — Lex IP Meister, PLLC

(57) ABSTRACT

The present invention relates to a method for preparing a semiconductor nanocrystal siloxane composite resin composition, and a cured product using the same. In the preparation method, the semiconductor nanocrystals are added during a non-hydrolytic sol-gel condensation reaction for forming a siloxane structure so that a siloxane resin having a dense inorganic network, which includes a siloxane bond, is encapsulated and thus is dispersed in the semiconductor nanocrystals through a chemical interaction and a chemical bond, thereby preventing a reduction in inherent characteristics (quantum efficiency) of the semiconductor nanocrystals resulting from an external oxidizing environment. Accordingly, when the curing of the resin composition is carried out, a cured product, which can be applied to various applications including a semiconductor nanocrystal siloxane composite having excellent reliability, can be provided.

8 Claims, 3 Drawing Sheets

(51) Int. Cl.
| | |
|---|---|
| *C08G 77/52* | (2006.01) |
| *C09K 11/54* | (2006.01) |
| *H01L 33/50* | (2010.01) |
| *H01L 33/56* | (2010.01) |
| *C09K 11/70* | (2006.01) |
| *C09K 11/56* | (2006.01) |
| *C09K 11/88* | (2006.01) |
| *C08L 83/04* | (2006.01) |
| C08G 77/00 | (2006.01) |
| C08G 77/20 | (2006.01) |

(52) U.S. Cl.
CPC .......... *C09K 11/565* (2013.01); *C09K 11/703* (2013.01); *C09K 11/883* (2013.01); *H01B 1/08* (2013.01); *H01L 33/502* (2013.01); *H01L 33/56* (2013.01); *C08G 77/20* (2013.01); *C08G 77/70* (2013.01); *C08G 77/80* (2013.01); *H01L 2933/005* (2013.01); *H01L 2933/0033* (2013.01); *H01L 2933/0041* (2013.01)

(58) Field of Classification Search
CPC ........ C08G 77/80; C09K 11/02; C09K 11/54; C09K 11/565; C09K 11/703; C09K 11/883; H01L 2933/0033; H01L 2933/0041; H01L 2933/005; H01L 33/502; H01L 33/56; H01B 1/08

See application file for complete search history.

METHOD FOR PREPARING SEMICONDUCTOR NANOCRYSTAL SILOXANE COMPOSITE RESIN COMPOSITION

TECHNICAL FIELD

This application claims priority to and the benefit of Korean Patent Application No. 10-2017-0037832 filed on Mar. 24, 2017 with the Korean Intellectual Property Office, the disclosure of which is incorporated herein by reference in its entirety.

The present invention relates to a method for preparing a semiconductor nanocrystal siloxane composite resin composition, and a cured product using the resin composition obtained therefrom.

BACKGROUND ART

Semiconductor nanocrystals, which are widely known as quantum dots, have a very small size in the range of several nanometers. Thus, the semiconductor nanocrystals exhibit different optical and physical properties from those inherent to bulk semiconductors due to the quantum confinement effect.

As the energy bandgap varies according to a change in size of the semiconductor nanocrystals due to the quantum confinement effect, the semiconductor nanocrystals may exhibit different optical and physical properties depending on the size thereof.

Due to such properties, research and development for applying the semiconductor nanocrystals to various optical elements are actively under way.

In order to apply the semiconductor nanocrystals to optical elements in various fields, semiconductor nanocrystals are generally used by flaking them into polymer resins.

In this case, as a matrix used for flaking of semiconductor nanocrystals, acryl-based or siloxane-based polymer resins having high transparency are widely used.

The siloxane-based resins whose main chain is composed of a siloxane bond have relatively high stability to ultraviolet rays and heat as compared with a hydrocarbon-based polymer resin whose main chain is composed of a carbon bond.

However, when the semiconductor nanocrystals are flaked in a polymer resin, the high surface energy of the semiconductor nanocrystals and incompatibility between organic hydrocarbon based ligand of semiconductor nanocrystals and polymer matrix cause the aggregation of semiconductor nanocrystals.

Accordingly, a process for ligand exchange of the semiconductor nanocrystals which imparts the compatibility with the polymer resin is essentially needed, and also, artificially flaked semiconductor nanocrystals polymer resins are weak in long-term storage stability.

In addition, in order to practically apply the semiconductor nanocrystals to optical devices, reliability that maintains optical characteristics (quantum efficiency) of the semiconductor nanocrystals without deterioration must be ensured, but the semiconductor nanocrystals composed of metals are easily oxidized in an oxidizing environment of heat, oxygen, and moisture, which causes serious deterioration in the quantum efficiency of the semiconductor nanocrystals.

Accordingly, studies and techniques have been previously proposed to solve the problems associated with flaking of the semiconductor nanocrystals in the polymer resin and the problem of being vulnerable to the oxidizing environment.

For example, in order to disperse a semiconductor nanocrystal in a siloxane-based polymer resin, methods for exchanging a conventional organic ligand present on the semiconductor nanocrystal surface with a siloxane-based ligand and the like have been proposed (see International Patent Application Nos. PCT/US2010/001283, PCT/US2013/045244, PCT/IB2013/059577, and PCT/US2011/000724).

However, the methods for exchanging the organic ligand of the semiconductor nanocrystal proposed above have the following problems.

That is, in general, the process of exchanging the organic ligand on the semiconductor nanocrystal surface involves a process by which an existing ligand is desorbed and a new ligand is adsorbed. In this case, defects inevitably occur on the surface of the semiconductor nanocrystals, and this is accompanied by a serious reduction in quantum efficiency, which is an inherent optical characteristic of the semiconductor nanocrystals.

(See Journal of the American Chemical Society, 2003, 125.48: 14652-14653, Journal of the American Chemical Society, 2004, 126.25: 7784-7785, Journal of the American Chemical Society, 2007, 129.3: 482-483, Langmuir, 2008, 24.10: 5270-5276.)

Therefore, there is a need to develop a method for preparing a novel semiconductor nanocrystal siloxane composite resin composition and a cured product which can uniformly flake the semiconductor nanocrystals in the siloxane-based polymer resin without aggregation (that is, achieve uniform dispersion), even without performing an organic ligand exchange process of the semiconductor nanocrystals, and which can effectively protect semiconductor nanocrystals from an external environment to improve reliability of an application element.

DETAILED DESCRIPTION OF THE INVENTION

Technical Problem

The present invention has been derived in order to overcome the problems encountered with the prior arts described above, and one object of the present invention is to provide a method for preparing a semiconductor nanocrystal siloxane composite resin composition capable of effectively improving quantum efficiency and stability of semiconductor nanocrystals by introducing the semiconductor nanocrystals during a non-hydrolytic sol-gel condensation reaction for forming a siloxane, thereby more effectively encapsulating the exterior of the semiconductor nanocrystals than before.

Further, another object of the present invention is to provide a cured product using the semiconductor nanocrystal siloxane composite resin composition obtained from the above method.

Technical Solution

The present invention provides a method for preparing a semiconductor nanocrystal siloxane composite resin composition including the steps of: preparing an organosilane mixture including at least one organoalkoxysilane and one organosilanediol; and adding semiconductor nanocrystals during a non-hydrolytic condensation reaction of the organosilane mixture for forming a siloxane.

In addition, the present invention provides a cured product which is formed by curing a semiconductor nanocrystal siloxane composite resin composition formed by the method described above, and which includes: nanocrystals; and a structure in which the surfaces of the semiconductor nanocrystals are encapsulated by a siloxane having a network structure.

Hereinafter, the present invention will be described in more detail.

The invention can be variously modified and take various forms, and thus specific embodiments are illustrated and described in detail below.

It should be understood, however, that the invention is not intended to be limited to any particular disclosure form, but includes all modifications, equivalents, and alternatives falling within the spirit and scope of the invention.

It will be further understood that the meaning of the terms "comprise" or "include" as used herein is intended to specify the presence of stated features, ranges, integers, steps, operations, elements, and/or components, but does not preclude the presence or addition of other features, ranges, integers, steps, operations, elements, and/or components.

Hereinafter, the method for preparing a semiconductor nanocrystal siloxane composite resin composition and a cured product using the same will be described in more detail.

Method for Preparing Semiconductor Nanocrystal Siloxane Composite Resin Composition According to one embodiment of the present invention, a method for preparing a semiconductor nanocrystal siloxane composite resin composition is provided, including the steps of: preparing an organosilane mixture including at least one organoalkoxysilane and one organosilanediol; and adding semiconductor nanocrystals during a non-hydrolytic sol-gel condensation reaction of the organosilane mixture for forming a siloxane.

The present inventors have filed a patent application directed to a semiconductor nanocrystal siloxane composite resin for protecting semiconductor nanocrystals from an external oxidizing environment using a hydrolytic or non-hydrolytic sol-gel condensation reaction of organoalkoxysilane and an organosilanediol (Korean Patent Application No. 10-2016-0085761).

However, the above method did not conduct the evaluation of quantum efficiency, which is the most important optical characteristic of semiconductor nanocrystals.

Accordingly, in view of the above, the present inventors seek protection for a method for preparing a siloxane composite resin composition synthesized by adding semiconductor nanocrystals during a non-hydrolytic sol-gel condensation reaction between an organoalkoxysilane and an organosilanediol, and a cured product using the resin composition.

Further, in order to achieve a more accurate reliability evaluation, the reliability evaluation was performed through evaluation tests of quantum efficiency of the semiconductor nanocrystal siloxane composite resin composition and the cured product.

According to the method of the present invention, as the semiconductor nanocrystals are uniformly encapsulated and dispersed in the siloxane structure, an aggregation phenomenon of the semiconductor nanocrystals does not occur in the siloxane composite resin for a long time, and also, the semiconductor nanocrystals in the cured product prepared through ultraviolet rays and/or heat curing are protected by the siloxane structure and thus exhibit excellent stability such that the optical characteristics (quantum efficiency) of the semiconductor nanocrystals are not deteriorated even when exposed to an external oxidizing environment (heat, oxygen, and moisture).

The method of the present invention as described above has a feature in that the semiconductor nanocrystals are added in the course of synthesizing a siloxane by a non-hydrolytic sol-gel condensation reaction, and preferably, during the reaction.

That is, the semiconductor nanocrystals can be added during stirring of the organosilane mixture.

Specifically, the siloxane composite resin composition in which the semiconductor nanocrystals are uniformly dispersed by a chemical interaction is prepared by a non-hydrolytic sol-gel condensation reaction of a mixture composed of at least one organoalkoxysilane and one organosilanediol.

The non-hydrolytic sol-gel condensation reaction is schematically represented by Reaction Scheme 1 below.

[Reaction Scheme 1]

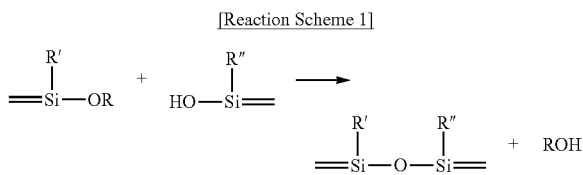

(In Reaction Scheme 1, R' and R" are as defined below.)

As can be seen from Reaction Scheme 1, a siloxane bond having a dense network structure, in which organic groups such as R' and R" are functionalized, is formed by a non-hydrolytic sol-gel condensation reaction of organoalkoxysilane and organosilanediol When the semiconductor nanocrystals are mixed during the formation of a siloxane having a network structure by a non-hydrolytic sol-gel condensation reaction of organoalkoxysilane and organosilanediol, an organic ligand on the surface of the semiconductor nanocrystals undergoes hydrophobic interaction with the organic functional groups such as R' and R" in Reaction Scheme 1.

Due to such interactions, it is possible to prepare a siloxane composite resin composition in which a siloxane having a network structure is formed around the semiconductor nanocrystals, and the semiconductor nanocrystals are encapsulated by the siloxane structure.

Therefore, according to the present invention, a step of preparing an organosilane mixture including at least one organoalkoxysilane and one organosilanediol as described above is performed for the non-hydrolytic sol-gel condensation reaction.

Subsequently, according to the present invention, a step of adding semiconductor nanocrystals during the non-hydrolytic sol-gel condensation reaction of the organosilane mixture for forming a siloxane is performed.

Accordingly, the present invention can induce a chemical interaction of the semiconductor nanocrystals with the siloxane composite resin composition, thus easily preparing the semiconductor nanocrystal siloxane composite resin composition without ligand exchange of the semiconductor nanocrystals.

In addition, the semiconductor nanocrystals can be added together or dividedly during a non-hydrolytic sol-gel condensation reaction (during stirring).

When the semiconductor nanocrystals are added dividedly, the full amount of the semiconductor nanocrystals can be added dividedly up to the time when sol-gel condensation reaction is completed.

However, the addition of the semiconductor nanocrystals can be performed at any time during the non-hydrolytic sol-gel condensation reaction and stirring.

When the semiconductor nanocrystals are added after the formation of the siloxane resin has been completed, there is a problem that the reliability thereof may not be maintained for a long time as compared with the composition and the cured product prepared by adding the semiconductor nanocrystals during the non-hydrolytic sol-gel condensation reaction.

Further, in the past, silane coupling agents, etc. may have been used instead of siloxane, but the effect of the present invention cannot be exhibited because it is mainly used only to increase the light emission or increase the dispersibility in resin by treating the surface of semiconductor nanocrystals.

Furthermore, it is preferred to add the semiconductor nanocrystals in as large an amount as possible, but a problem may arise when too great an amount is added.

That is, as the added amount of the semiconductor nanocrystals increases, the aggregation phenomenon between semiconductor nanocrystals occurs more easily.

Therefore, the semiconductor nanocrystals may be added in an amount of 0.001 to 10 parts by weight based on 100 parts by weight of the siloxane resin.

When the semiconductor nanocrystals are used in too small an amount, at less than 0.001 parts by weight, the desired optical and physical effects cannot be exhibited.

Meanwhile, the non-hydrolytic sol-gel condensation reaction can be preferably carried out in the presence of a base catalyst.

The base catalyst may be at least one selected from the group consisting of an alkali metal compound, an alkaline earth metal compound, a quaternary ammonium compound, ammonia, an amine compound, and a basic ion exchange resin.

The alkali metal compound may include sodium hydroxide, potassium hydroxide, lithium hydroxide, etc.

The alkaline earth metal compound may include barium hydroxide monohydrate, barium hydroxide octahydrate, calcium hydroxide, magnesium hydroxide, aluminum hydroxide, strontium hydroxide, etc.

The quaternary ammonium compound may include tetraalkylammonium silanolate, tetraammonium hydroxide, tetramethylammonium chloride, tetrabutylammonium fluoride, or the like.

However, the types of the base catalyst are not limited.

The base catalyst may be added in an amount of 0.00001 to 20 mol % based on 1 mol % of organosilane, but is not particularly limited thereto.

The non-hydrolytic sol-gel condensation reaction may be preferably carried out by adjusting the reaction temperature, the reaction atmosphere, and the type and amount of the base catalyst.

For example, the reaction is sufficiently carried out by stirring at room temperature for 2 to 120 hours, and it may be carried out at 40 to 150° C., preferably 80 to 100° C., for 2 to 48 hours, in order to increase the reaction rate.

In addition, as can be seen in Reaction Scheme 1, when the reaction occurs, alcohols as by-products are produced and may be present in the resin, but they can be removed by applying the conditions of about 50 to 120° C. under atmospheric pressure and reduced pressure for 10 minutes to 8 hours.

Moreover, in one embodiment of the present invention, the organoalkoxysilane may be selected from the compound represented by Chemical Formula 1 below or a mixture thereof.

   [Chemical Formula 1]

(In Chemical Formula 1, each $R^1$ is independently selected from the group consisting of a $(C_1\text{~}C_{20})$ alkyl, a $(C_3\text{~}C_8)$ cycloalkyl, or a $(C_1\text{~}C_{20})$ alkyl substituted with a $(C_3\text{~}C_8)$ cycloalkyl; a $(C_2\text{~}C_{20})$ alkenyl; a $(C_2\text{~}C_{20})$ alkynyl; and a $(C_6\text{~}C_{20})$ aryl, each $R^2$ is independently a linear or branched $(C_1\text{~}C_7)$ alkyl, and n is an integer of 0 to 3.)

Accordingly, examples of the structure of Chemical Formula 1 may include any one of the following structural formulas.

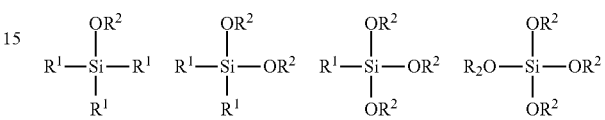

In Chemical Formula 1, $R^1$ may preferably include a functional group, such as an acrylic group, a methacryl group, an aryl group, a halogen group, an amino group, a mercapto group, an ether group, an epoxy group, a vinyl group, a hydrogen group, a methyl group, a phenyl group, an isocyanate group, and the like.

More specifically, the organoalkoxysilane may be at least one selected from the group consisting of tetraethoxysilane, tetramethoxysilane, N-(3-acryloxy-2-hydroxypropyl)-3-aminopropyltriethoxysilane, N-3-(acryloxy-2-hydroxypropyl)-3-aminopropyltrimethoxysilane, N-3-(acryloxy-2-hydroxypropyl)-3-aminopropyltripropoxysilane, 3-acryloxypropylmethylbis(trimethoxy)silane, 3-acryloxypropyltrimethoxysilane, 3-acryloxypropyltriethoxysilane, 3-acryloxypropyltripropoxysilane, 3-(meth)acryloxypropyltrimethoxysilane, 3-(meth)acryloxypropyltriethoxysilane, 3-(meth)acryloxypropyltripropoxysilane, 2-(3,4-epoxycyclohexyl)ethyltrimethoxysilane, 2-(3,4-epoxycyclohexyl)ethyltriethoxysilane, vinyltrimethoxysilane, vinyltriethoxysilane, vinyltripropoxysilane, methyltrimethoxysilane, methyltriethoxysilane, methyldimethoxysilane, methyldiethoxysilane, phenyltrimethoxysilane, phenyltriethoxysilane, diphenyldimethoxysilane, diphenyldiethoxysilane, N-(aminoethyl-3-aminopropyl)trimethoxysilane, N-(2-aminoethyl-3-aminopropyl)triethoxysilane, 3-aminopropyltrimethoxysilane, 3-aminopropyltriethoxysilane, 3-isocyanatopropyltriethoxysilane, heptadecafluorodecyltrimethoxysilane, chloropropyltrimethoxysilane, and chloropropyltriethoxysilane, but is not limited thereto.

The organosilanediol may be a silane compound in which an organic functional group is bonded to a substituted or unsubstituted chain and two hydroxyl groups, and for example, it may be selected from the compound represented by Chemical Formula 2 below or a mixture thereof.

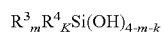   [Chemical Formula 2]

(In Chemical Formula 2, $R^3$ and $R^4$ may each independently be at least one selected from the group consisting of a $(C_1\text{~}C_{20})$ alkyl, a $(C_3\text{~}C_8)$ cycloalkyl, a $(C_1\text{~}C_{20})$ alkyl substituted with a $(C_3\text{~}C_8)$ cycloalkyl, a $(C_2\text{~}C_{20})$ alkenyl, a $(C_2\text{~}C_{20})$ alkynyl, and a $(C_6\text{~}C_{20})$aryl, or it may include at least one functional group selected from the group consisting of an acrylic group, a methacryl group, an aryl group, a halogen group, an amino group, a mercapto group, an ether group, a $(C_1\text{~}C_{20})$ alkoxy group, a sulfone group, a nitro group, a hydroxy group, a cyclobutene group, a carbonyl group, a carboxyl group, an alkyd group, a urethane group, a vinyl group, a nitrile group, an epoxy group, an oxetane group, and a phenyl group, and m and k are each an integer of 0 to 3.)

More specifically, the organosilanediol may preferably be at least one selected from the group consisting of diphenylsilanediol, diisobutylsilanediol, 1,4-bis(hydroxydimethylsilyl)benzene, and 4-vinyldiphenylsilanediol, but is not limited thereto.

Further, the organoalkoxysilane and the organosilanediol may preferably be used in a molar ratio of 1:0.2 to 5.0 or 1:0.2 to 4.0.

The semiconductor nanocrystals may be selected from the group consisting of a Group II-VI compound, a Group II-V compound, a Group III-VI compound, a Group III-V compound, a Group IV-VI compound, a Group II-III-VI compound, a Group I-IV-VI compound, a Group II-IV-V compound, an alloy thereof, and a combination thereof.

However, the types of the semiconductor nanocrystals are not limited thereto, and can be appropriately selected and used.

As the Group II element, Zn, Cd, Hg, or a combination thereof may be used, and as the Group III element, Al, Ga, In, Ti, or a combination thereof may be used.

As the Group IV element, Si, Ge, Sn, Pb, or a combination thereof may be used.

As the Group V element, P, As, Sb, Bi, or a combination thereof may be used, and as the Group VI element, O, S, Se, Te, or a combination thereof may be used.

The group II-VI semiconductor compound may be selected from the group consisting of a binary compound such as CdS, CdSe, CdTe, ZnS, ZnSe, ZnTe, ZnO, HgS, HgSe, HgTe, and the like, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, and the like, or a quaternary compound such as CdZnSeS, CdZnSeTe, CdZnSTe, CdHgSeS, CdHgSeTe, CdHgSTe, HgZnSeS, HgZnSeTe, HgZnSTe, and the like.

The group III-V semiconductor compound may be selected from the group consisting of a binary compound such as GaN, GaP, GaAs, GaSb, AlN, AlP, AlAs, AlSb, InN, InP, InAs, InSb, and the like, a ternary compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlInAs, AlInSb, and the like, or a quaternary compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like.

The group IV-VI semiconductor compound may be selected from the group consisting of a binary compound such as SnS, SnSe, SnTe, PbS, PbSe, PbTe, and the like, a ternary compound such as SnSeS, SnSeTe, SnSTe, PbSeS, PbSeTe, PbSTe, SnPbS, SnPbSe, SnPbTe, and the like, or a quaternary compound such as SnPbSSe, SnPbSeTe, SnPbSTe, and the like. The group IV semiconductor compound may be selected from the group consisting of a single-element compound such as Si, Ge, and the like, or a binary compound such as SiC, SiGe, and the like.

The semiconductor nanocrystal may include a core or core-shell structure, or a multi-layered structure including an alloy interlayer of two or more materials.

Specifically, the semiconductor nanocrystals may have a core or core-shell structure.

The shell may include at least one layer.

In addition, the shell may be composed of a Group II-VI semiconductor, a Group III-V semiconductor, a Group IV-VI semiconductor, or a combination thereof.

When the semiconductor nanocrystals have a multi-layered structure, it may be a multi-layered structure composed of two or more kinds of materials.

Such a multi-layered structure may include an alloy interlayer of two or more materials at the interface between each layer, and the alloy interlayer may be a gradient alloy having a gradient of the material composition.

The semiconductor nanocrystals may further include an organic ligand compound, a solvent, or a combination thereof.

In addition, in order to impart secondary performance of the semiconductor nanocrystal siloxane composite resin, an organic fluorescent substance, an inorganic fluorescent substance, a conjugated polymer, a surfactant, a light diffusing agent, an antioxidant, an active oxygen remover, a silica sol, an oxide, a heat resistant agent, etc. can be added within a range that does not affect the effect of the present invention, but is not limited thereto.

Further, the amount of the additives is not particularly limited, and may be used according to a method that is well known in the art.

According to one embodiment of the present invention, in order to control the viscosity, free volume, and the like of the semiconductor nanocrystal siloxane composite resin and to facilitate the processability, a reactive monomer or oligomer capable of ultraviolet curing and/or heat curing can be further added.

The amount of the reactive monomer or oligomer is not particularly limited, but may be added in an amount of about 1 to about 100 parts by weight based on 100 parts by weight of the siloxane composite resin.

The reactive monomer or oligomer may have a vinyl group, an epoxy group, an acrylic group, a (meth)acrylic group, or an oxetane group, but is not limited thereto.

According to the present invention, through the above-described steps, semiconductor nanocrystals are added and mixed in the course of synthesizing a siloxane by the non-hydrolytic sol-gel condensation of the mixture of at least one organoalkoxysilane and one organosilanediol, and thereby the siloxane structure to be synthesized can encapsulate the exterior of the semiconductor nanocrystals.

According to the method of the present invention, in the semiconductor nanocrystal siloxane composite composition and the cured product, the semiconductor nanocrystals are encapsulated by the siloxane structure and thus are protected from the external oxidizing environment (heat, oxygen, and moisture), thereby enhancing the reliability of the element without deteriorating the inherent characteristics (quantum efficiency) of the semiconductor nanocrystals in the siloxane composite.

In particular, an organic ligand exchanging process, which causes a severe deterioration in the quantum efficiency of the semiconductor nanocrystals, is not used for achieving the purpose of the present invention.

Cured Product

On the other hand, according to another embodiment of the present invention, a cured product is provided, which is prepared by curing a semiconductor nanocrystal siloxane composite resin composition formed by the method described above and which includes semiconductor nanocrystals, and a structure in which the surfaces of the semiconductor nanocrystals are encapsulated by a siloxane having a network structure.

Specifically, the semiconductor nanocrystal siloxane composite resin composition of the present invention is prepared as a solid-type cured product through an ultraviolet curing and/or heat curing step in which a curable organic functional group is modified.

In the cured product of the present invention obtained according to such method, the semiconductor nanocrystals are used as a core and the surface thereof is encapsulated with siloxane having a network structure, thereby being able to protect the semiconductor nanocrystals from the external oxidizing environment.

FIG. 1 schematically shows the structure of the cured product using the semiconductor nanocrystal siloxane composite resin composition of the present invention.

In FIG. 1, the circular structure at the center represents semiconductor nanocrystals, and the siloxane having a network structure is located around the surface thereof in a capsule shape.

In addition, the semiconductor nanocrystal siloxane composite resin composition may further include an ultraviolet initiator, a heat curing initiator, a photocatalyst, a heat curing catalyst, or a mixture thereof.

The types of the components used in the curing are not particularly limited, and ultraviolet or heat curing initiators or catalysts that are well known in the art can be used.

Further, the use amount thereof is not particularly limited as long as a cured product can be formed.

In one embodiment of the present invention, the semiconductor nanocrystal siloxane composite resin composition can be prepared as a cured product by using various forming methods such as coating, casting, molding, and 3D printing, but is not limited thereto.

In addition, in order to impart secondary performance of the cured product, an organic fluorescent substance, an inorganic fluorescent substance, a conjugated polymer, a surfactant, a light diffusing agent, an antioxidant, an active oxygen remover, a silica sol, an oxide, a heat resistant agent, etc. can be added within a range that does not affect the effect of the present invention, but is not limited thereto.

Further, the amount of the additives is not particularly limited, and may be used according to a method that is well known in the art.

The curing step of the semiconductor nanocrystal siloxane composite resin composition can be carried out in the presence of a catalyst that is commonly used in the art.

The cured product may include a step of heat treating under vacuum at a temperature of 250° C. or less, and preferably 50° C. to 200° C. or less, for 1 minute to 24 hours after curing, but is not limited thereto.

The addition of the catalyst may be carried out in a temperature range of 20° C. to 150° C., but is not particularly limited.

The cured product obtained according to such method can be applied as elements for various devices.

For example, the cured product of the present invention can be used as a film, a sheet, or an LED encapsulant.

For example, the semiconductor nanocrystal siloxane composite resin composition and the cured product can be applied to display or lighting devices such as an optical wavelength converter, a laser, a color filter, a solar cell, an LED device, etc.

Preferably, it can be incorporated into a display or lighting device.

Advantageous Effects

The method for preparing a semiconductor nanocrystal siloxane composite resin composition and a cured product prepared according to the present invention can achieve uniform dispersion and encapsulation in the cured product through chemical interaction and bonding between semiconductor nanocrystals and a siloxane resin even without an organic ligand exchange of conventional semiconductor nanocrystals.

In particular, the siloxane having a network structure protects the semiconductor nanocrystals in the cured product prepared through curing of the resin composition of the present invention from the external oxidizing environment (heat, oxygen, or moisture), thereby implementing high reliability without deteriorating quantum efficiency, which is an optical characteristic of the semiconductor nanocrystals.

In addition, according to the method of the present invention, the quantum efficiency of the semiconductor nanocrystals in the cured product can be increased in a moisture oxidizing environment, thereby implementing high reliability.

Therefore, the reliability of devices to which the composite resin composition and the cured products are applied can also be enhanced, and thus the method of the present invention can be widely applied to the fields of optics and displays.

DETAILED DESCRIPTION OF THE EMBODIMENTS

Figure 1:
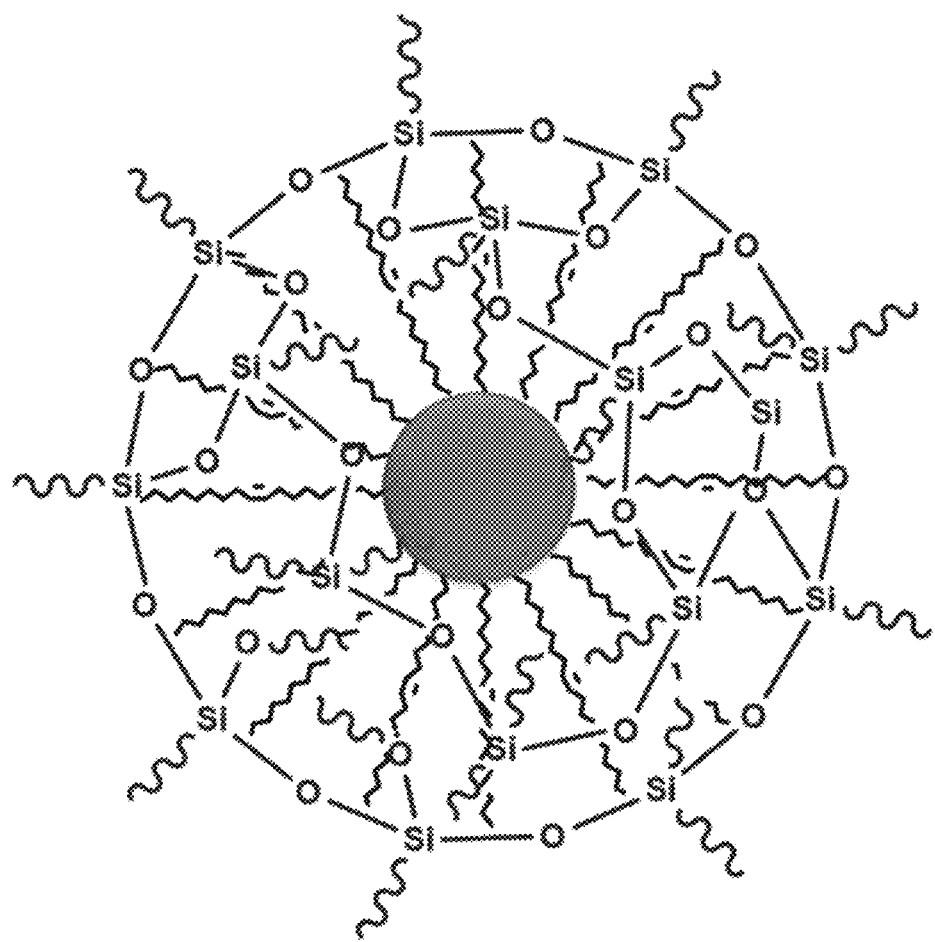
FIG. 1 schematically shows the structure of the cured product using the semiconductor nanocrystal siloxane composite resin composition of the present invention.

Hereinafter, the effect of the present invention will be described in more detail by way of specific examples.

However, these examples are given for illustrative purposes only, and the scope of the invention is not intended to be limited by these examples.

Example 1

3-(meth)acryloxypropyltrimethoxysilane and diphenylsilanediol were added to a 250 ml 2-neck flask at a molar ratio of 1:1, and then barium hydroxide monohydrate (Ba(OH)$_2$.H$_2$O) was added as a catalyst in an amount of 0.1 mol % relative to silane.

Then, the mixture was stirred at 85° C. for 5 hours to perform a non-hydrolytic condensation reaction.

At this time, semiconductor nanocrystals were added as a mixture during stirring of organosilane mixture so that the semiconductor nanocrystals were dispersed during the formation of a siloxane structure, thereby preparing a siloxane composite resin composition.

As for the semiconductor nanocrystals used above, Nanodot-HE-620 (trade name, Ecoflux, Korea) having a Cd-based core-shell structure was used.

The semiconductor nanocrystals were dispersed in a chloroform solvent, and added in an amount of 1.0 parts by weight based on 100 parts by weight of the siloxane resin (excluding the weight of the solvent).

When the non-hydrolytic sol-gel condensation reaction was completed, a photo curing catalyst (2,2-dimethoxy-2-phenylacetophenone) was added to the siloxane composite resin composition in an amount of 0.2 parts by weight based on 100 parts by weight of the entire siloxane composite resin composition, followed by stirring to prepare a semiconductor nanocrystal siloxane composite resin composition.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 2

A semiconductor nanocrystal siloxane composite resin composition was prepared in the same manner as in Example 1, except that 3-(meth)acryloxypropyltrimethoxysilane and diisobutylsilanediol were used at a molar ratio of 1:1 instead of 3-(meth)acryloxypropyltrimethoxysilane and diphenylsilanediol and that sodium hydroxide was added as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 3

A semiconductor nanocrystal siloxane composite resin composition was prepared in the same manner as in Example 1, except that 3-(meth)acryloxypropyltrimethoxysilane and 1,4-bis(hydroxydimethylsilyl)benzene were used at a molar ratio of 1:1 instead of 3-(meth)acryloxypropyltrimethoxysilane and diphenylsilanediol and that tetraalkylammonium hydroxide was added as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 4

A semiconductor nanocrystal siloxane composite resin composition was prepared in the same manner as in Example 1, except that potassium hydroxide was added instead of barium hydroxide monohydrate as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 5

A semiconductor nanocrystal siloxane composite resin composition was prepared in the same manner as in Example 1, except that aluminum hydroxide was added instead of barium hydroxide monohydrate as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 6

A semiconductor nanocrystal siloxane composite resin composition was prepared in the same manner as in Example 1, except that 3-(meth)acryloxypropyltrimethoxysilane and 1,4-bis(hydroxydimethylsilyl)benzene were used at a molar ratio of 1:1 instead of 3-(meth)acryloxypropyltrimethoxysilane and diphenylsilanediol and that tetraalkylammonium silanolate was added as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 7

3-(meth)acryloxypropyltrimethoxysilane and diphenylsilanediol were added to a 250 ml 2-neck flask at a molar ratio of 1:1, and then barium hydroxide monohydrate (Ba(OH)$_2$.H$_2$O) was added as a catalyst in an amount of 0.1 mol % relative to silane.

Then, the mixture was stirred at 85° C. for 5 hours to perform a non-hydrolytic condensation reaction.

semiconductor nanocrystals were added as a mixture during stirring of organosilanes so that the semiconductor nanocrystals were dispersed during the formation of a siloxane structure, thereby preparing a siloxane composite resin composition.

As for the semiconductor nanocrystals used above, an In-based core-multi-shell structure (InPZnS/ZnSe/ZnS) was used.

The semiconductor nanocrystals were dispersed in a chloroform solvent, and added in an amount of 1.0 part by weight based on 100 parts by weight of the siloxane resin (excluding the weight of the solvent).

When the non-hydrolytic sol-gel condensation reaction was completed, a photocuring catalyst (2,2-dimethoxy-2-phenylacetophenone) was added to the siloxane composite resin composition in an amount of 0.2 parts by weight based on 100 parts by weight of the entire siloxane composite resin composition, followed by stirring to prepare a semiconductor nanocrystal siloxane composite resin composition.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Example 8

A semiconductor nanocrystal siloxane composite resin composition was prepared in the same manner as in Example 7, except that 3-(meth)acryloxypropyltrimethoxysilane and diisobutylsilanediol were used at a molar ratio of 1:1 instead of 3-(meth)acryloxypropyltrimethoxysilane and diphenylsilanediol and that sodium hydroxide was added as a catalyst in an amount of 0.1 mol % relative to silane.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Comparative Examples

In order to show the effect of protecting the semiconductor nanocrystals from the external oxidizing environment due to encapsulating by siloxane structure, in which semiconductor nanocrystals were added during non-hydrolytic sol-gel condensation, which is a characteristic of the siloxane composite resin composition and the cured product thereof having dispersed semiconductor nanocrystals according to the present invention, Comparative Example 1 of a hydrocarbon type not including the siloxane structure and Comparative Example 2 prepared by mixing the semiconductor nanocrystals after the formation of the siloxane structure were carried out.

Comparative Example 1

As the polymer resin, a hydrocarbon-based acrylic resin (Miramer M244 (trade name), Miwon Chemical, Korea) was used.

The semiconductor nanocrystals were added to the acrylic resin and then stirred at 85° C. for 5 hours to remove the solvent of solution, in which the semiconductor nanocrystals were dispersed.

As the semiconductor nanocrystals used above, Nanodot-HE-620 (trade name Ecoflux, Korea) having a Cd-based core-shell structure was used.

The semiconductor nanocrystals were in a state of being dispersed in a chloroform solvent, and added in an amount of 1.0 parts by weight based on 100 parts by weight of the hydrocarbon-based acrylic resin (excluding the weight of the solvent).

Thereafter, 2,2-dimethoxy-2-phenylacetophenone as a photocuring catalyst was added to the resin composition in an amount of 0.2 parts by weight based on 100 parts by weight of the polymer resin, followed by stirring.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

Comparative Example 2

A semiconductor nanocrystal siloxane composite resin composition was prepared in the same manner as in Example 1, except that the formation of the siloxane structure was completed and then the semiconductor nanocrystals were added.

The semiconductor nanocrystal siloxane composite resin composition thus prepared was placed into a circular mold having a diameter of 1 cm and molded to a thickness of 1 mm, and then exposed to an ultraviolet lamp of a wavelength of 365 nm for 10 minutes to prepare a cured product.

[Experimental Example 1] Evaluation of Dispersion Stability and Uniformity

With respect to the compositions and the cured products according to Examples 1 to 8 and Comparative Examples 1 and 2 prepared as described above, the dispersion stability and uniformity of light-emitting characteristics (emission wavelengths) of the semiconductor nanocrystals in the compositions and the cured products were confirmed using the drawings (FIGS. 2 and 3) and ARAMIS (Horiba Jobin Yvon).

Figure 2:
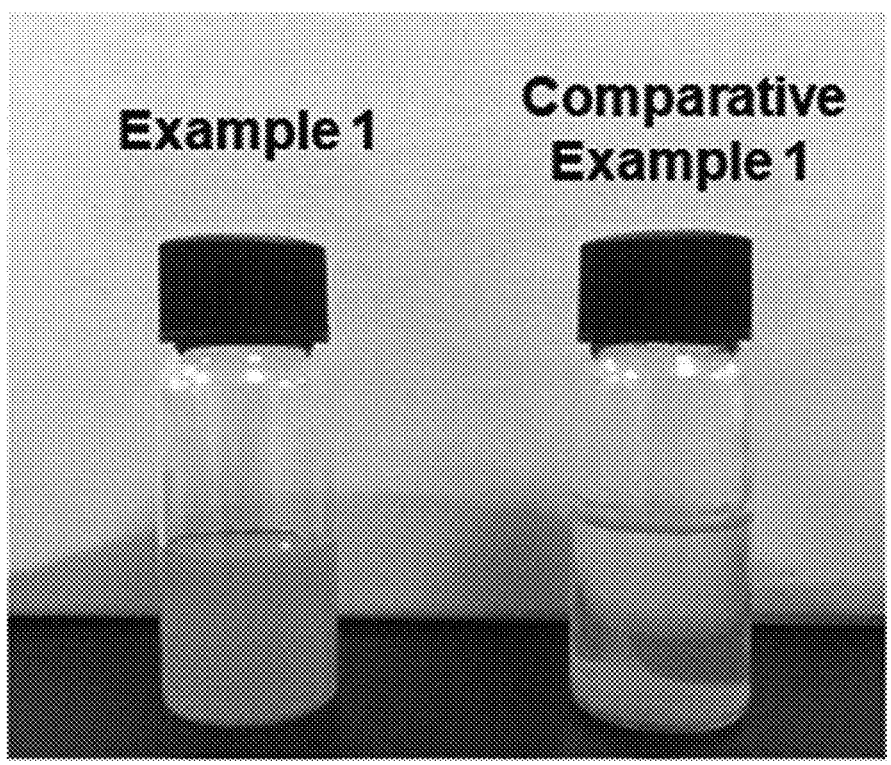
FIG. 2 shows dispersion stability of the semiconductor nanocrystals in the compositions of Example 1 and Comparative Example 1.

FIG. 2 shows dispersion stability of the semiconductor nanocrystals in the compositions of Example 1 and Comparative Example 1.

Figure 3:
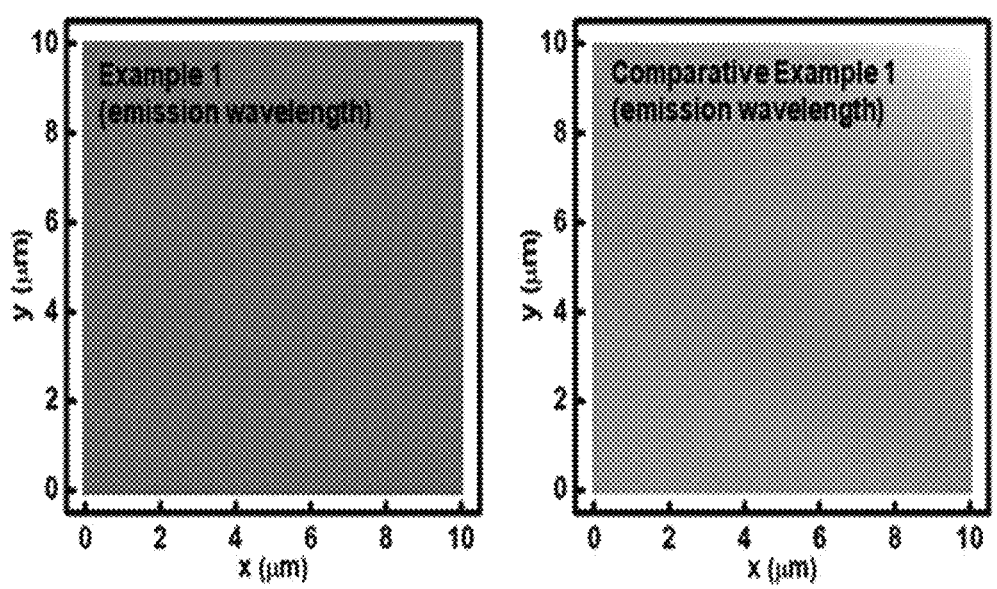
FIG. 3 shows light-emitting uniformity of the semiconductor nanocrystals in the cured products of Example 1 and Comparative Example 1.

FIG. 3 shows light-emitting uniformity (dispersion uniformity) of the semiconductor nanocrystals in the cured products of Example 1 and Comparative Example 1.

Referring to FIG. 2, the semiconductor nanocrystals in the composition of Example 1 maintained uniform dispersion without aggregation. However, it can be confirmed that the semiconductor nanocrystals in the hydrocarbon-based acrylic resin of Comparative Example 1 were aggregated and precipitated.

Referring to FIG. 3, the semiconductor nanocrystals in the cured product of Example 1 showed a uniform light-emitting wavelength in the region of 100 um$^2$, confirming that the semiconductor nanocrystals were uniformly dispersed in the cured product without aggregation.

However, it can be seen that the semiconductor nanocrystals in the cured product of Comparative Example 1 did not show a uniform light-emitting wavelength in the region of 100 um$^2$.

As a result, it was confirmed that, in the semiconductor nanocrystal siloxane composite composition and the cured product according to the present invention, the semiconductor nanocrystals were uniformly dispersed without an organic ligand exchange, thereby showing uniform light-emitting characteristics in the randomly selected region.

[Experimental Example 2] Evaluation of High Temperature Reliability (85° C.)

The cured products according to Examples 1 to 8 and Comparative Examples 1 and 2 prepared as described above were exposed to an oxidizing environment of 85° C., where high heat and oxygen were present, for 40 days, and the change in the absolute quantum efficiency was measured by using an absolute quantum efficiency spectrometer manufactured by Hamamatsu (Quantaurus-QY C11347).

Table 1 shows the changes in the absolute quantum efficiency after exposure to the high temperature environment in the examples and comparative examples.

TABLE 1

|  | Change in absolute quantum efficiency after exposure to 85° C. for 20 days (Δ%) | Change in absolute quantum efficiency after exposure to 85° C. for 40 days (Δ%) |
| --- | --- | --- |
| Example 1 | 0 | 0 |
| Example 2 | 0 | 0 |
| Example 3 | 0 | 0 |
| Example 4 | 0 | −2 |
| Example 5 | −0.5 | −2 |
| Example 6 | −1 | −1 |
| Example 7 | −2 | −3 |
| Example 8 | −2 | −3 |
| Comparative Example 1 | −25 | −42 |
| Comparative Example 2 | −5 | −12 |

Referring to Table 1, it can be seen that the absolute quantum efficiency of the cured product of the semiconductor nanocrystal siloxane composite according to Examples 1 to 8 had a reduction of up to 3%, the absolute quantum efficiency of the cured product of the semiconductor nanocrystal polymer composite according to Comparative Example 1 had a reduction of 42%, and the absolute quantum efficiency of the cured product according to Comparative Example 2 had a reduction of 12%.

Thus, the cured product of the siloxane composite including the semiconductor nanocrystals according to the present invention can be applied to an optical device with high reliability that maintains the quantum efficiency of the semiconductor nanocrystals in the high temperature oxidizing environment.

Meanwhile, it can be seen that the absolute quantum efficiency of Comparative Example 1 not including the siloxane structure showed the greatest reduction, and the absolute quantum efficiency of Comparative Example 2 including the siloxane structure but having a difference in the preparation method (semiconductor nanocrystals were mixed after the formation of the siloxane structure) was reduced by 12%.

[Experimental Example 3] Evaluation of High Temperature and High Humidity Reliability (85° C./85% Relative Humidity)

The cured products according to Examples 1 to 8 and Comparative Examples 1 and 2 prepared as described above were exposed to an oxidizing environment of 85° C./85% relative humidity where high heat, oxygen, and moisture were present, for 40 days, and the change in the absolute quantum efficiency was measured by using an absolute quantum efficiency spectrometer manufactured by Hamamatsu (Quantaurus-QY C11347).

Table 2 shows the amount of change in the absolute quantum efficiency after exposure to the high temperature and high humidity environment of each of the examples and comparative examples.

TABLE 2

| | Change in absolute quantum efficiency after exposure to 85° C./85% relative humidity for 20 days (Δ%) | Change in absolute quantum efficiency after exposure to 85° C. for 40 days (Δ%) |
| --- | --- | --- |
| Example 1 | +13.5 | +13.5 |
| Example 2 | +12.5 | +13 |
| Example 3 | +11 | +12.8 |
| Example 4 | +10.5 | +12 |
| Example 5 | +10 | +11 |
| Example 6 | +12.1 | +12.5 |
| Example 7 | +1 | +3 |
| Example 8 | +2 | +4 |
| Comparative Example 1 | −19 | −32 |
| Comparative Example 2 | −5 | −8 |

Referring to Table 2, the absolute quantum efficiency of the cured products according to Examples 1 to 6 was increased up to 13.5% without reduction.

However, it can be seen that the absolute quantum efficiency of the cured product of Comparative Example 1 was reduced by 32%, and the absolute quantum efficiency of the cured product of Comparative Example 2 was reduced by 8%.

Thus, it was confirmed that the cured product of Comparative Example 1 not including the siloxane structure could not protect the semiconductor nanocrystals from the external oxidizing environment under the high temperature and high humidity.

In addition, it can be seen that, since the cured product of Comparative Example 2 contained the siloxane structure but had a difference in the preparation method (semiconductor crystals were mixed after formation of the siloxane structure), the absolute quantum efficiency was reduced by 8%.

Meanwhile, it can be seen that the cured product of the siloxane composite including the semiconductor nanocrystals according to the present invention showed no reduction in the quantum efficiency of the semiconductor nanocrystals in the high temperature and the high temperature and high humidity oxidizing environments as the semiconductor nanocrystals were particularly added during the non-hydrolytic sol-gel condensation reaction for forming a siloxane.

Further, according to the present invention, surprisingly, it can be confirmed that the absolute quantum efficiency of the semiconductor nanocrystals remarkably increases and is maintained in a moist environment.

It can be judged that water molecules present in the moist environment remove the defects on the surface of the semiconductor nanocrystals, thereby increasing the absolute quantum efficiency.

Accordingly, in the present invention, the absolute quantum efficiency can be increased and maintained in the high temperature and high humidity oxidizing environment.

In addition, it can be seen from Experimental Examples 1 to 3 described above that, in the composition and the cured product prepared according to the present invention, the semiconductor nanocrystals were uniformly dispersed in the cured product without an organic ligand exchange process on the surface thereof, which inevitably leads to a reduction in the quantum efficiency of semiconductor nanocrystals, thereby exhibiting uniform light-emitting characteristics.

Further, the cured product of the present invention exhibited excellent stability in that the quantum efficiency, which is an important optical characteristic of the semiconductor nanocrystals, is not deteriorated, even under exposure to the high temperature and the high temperature and high humidity oxidizing environments for a long time.

Therefore, the method of the present invention can achieve reliability of various applications to which the semiconductor nanocrystals are applied.

The invention claimed is:

1. A method for preparing a semiconductor nanocrystal siloxane composite resin composition, comprising:
   preparing an organosilane mixture comprising at least one organoalkoxysilane and one organosilanediol; and
   adding semiconductor nanocrystals during a non-hydrolytic sol-gel condensation reaction of the organosilane mixture for forming a siloxane.

2. The method for preparing a semiconductor nanocrystal siloxane composite resin composition of claim 1, wherein the semiconductor nanocrystals are added in an amount of 0.001 to 10 parts by weight based on 100 parts by weight of the siloxane resin.

3. The method for preparing a semiconductor nanocrystal siloxane composite resin composition of claim 1, wherein the organoalkoxysilane is selected from the compound represented by Chemical Formula 1 below, or a mixture thereof:

 [Chemical Formula 1]

$R^1{}_n Si(OR^2)_{4-n}$ (in Chemical Formula 1,
each $R^1$ is independently selected from the group consisting of a ($C_1$~$C_{20}$) alkyl, ($C_3$~$C_8$) a cycloalkyl, or a ($C_1$~$C_{20}$) alkyl substituted with a ($C_3$~$C_8$) cycloalkyl, a ($C_2$~$C_{20}$) alkenyl, a ($C_2$~$C_{20}$) alkynyl, and a ($C_6$~$C_{20}$) aryl, each R2 is independently a linear or branched (C1~C7) alkyl, and n is an integer of 0 to 3).

4. The method for preparing a semiconductor nanocrystal siloxane composite resin composition of claim 1, wherein the organoalkoxysilane is at least one selected from the group consisting of diphenylsilanediol, diisobutylsilanediol, 1,4-bis(hydroxydimethylsilyl)benzene, and 4-vinyldiphenylsilanediol.

5. The method for preparing a semiconductor nanocrystal siloxane composite resin composition of claim 1, wherein the non-hydrolytic sol-gel condensation reaction is carried out in the presence of a base catalyst.

6. The method for preparing a semiconductor nanocrystal siloxane composite resin composition of claim 5, wherein the base catalyst is at least one selected from the group consisting of an alkali metal compound, an alkaline earth metal compound, a quaternary ammonium compound, ammonia, an amine compound, and a basic ion exchange resin.

7. The method for preparing a semiconductor nanocrystal siloxane composite resin composition of claim 1, wherein the semiconductor nanocrystals are selected from the group consisting of a Group II-VI compound, a Group II-V compound, a Group III-VI compound, a Group III-V compound, a Group IV-VI compound, a Group II-III-VI compound, a Group II-IV-VI compound, a Group II-IV-V compound, an alloy thereof, and a combination thereof.

8. The method for preparing a semiconductor nanocrystal siloxane composite resin composition of claim 1, wherein the semiconductor nanocrystal comprises a core or core-shell structure, or a multi-layered structure comprising an alloy interlayer of two or more materials.

* * * * *